(12) United States Patent
Saia et al.

(10) Patent No.: US 6,429,381 B1
(45) Date of Patent: Aug. 6, 2002

(54) HIGH DENSITY INTERCONNECT MULTICHIP MODULE STACK AND FABRICATION METHOD

(75) Inventors: Richard Joseph Saia, Niskayuna; Robert John Wojnarowski, Ballston Lake; Stanton Earl Weaver, Jr., Northville; Kevin Matthew Durocher, Waterford; Christopher James Kapusta, Duanesburg; James Enrico Sabatini, Scotia, all of NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/681,555

(22) Filed: Apr. 27, 2001

(51) Int. Cl.[7] .................................................. H05K 1/03
(52) U.S. Cl. .......................... 174/255; 174/261; 29/729; 29/739; 257/693
(58) Field of Search ................................. 174/262, 261, 174/255, 52.4; 257/693; 439/667; 29/729, 739

(56) References Cited

U.S. PATENT DOCUMENTS

| | | | | |
|---|---|---|---|---|
| 4,750,090 A | * | 6/1988 | Abe | 361/741 |
| 5,657,537 A | | 8/1997 | Saia et al. | |
| 5,699,234 A | | 12/1997 | Saia et al. | |
| 5,739,578 A | * | 4/1998 | Goto | 257/578 |
| 5,844,168 A | * | 12/1998 | Schueller et al. | 174/52.4 |
| 6,290,540 B1 | * | 9/2001 | Nisho et al. | 439/607 |

* cited by examiner

*Primary Examiner*—Albert W. Paladini
(74) *Attorney, Agent, or Firm*—Ann M. Agosti; Jill M. Breedlove

(57) ABSTRACT

A method for fabricating a substrate package for a high density interconnect multichip module stack comprises: providing a substrate having holes extending therethrough and having a bottom surface with metallization situated thereon; providing a metal sheet having grooves extending therethrough; attaching the metal sheet to the bottom surface of the substrate; attaching metal plugs through the holes to the metal sheet; and removing portions of the substrate to expose the metal plugs and separate the metal sheet into a plurality of segments defined by the grooves.

20 Claims, 3 Drawing Sheets

HIGH DENSITY INTERCONNECT MULTICHIP MODULE STACK AND FABRICATION METHOD

FEDERAL RESEARCH STATEMENT

This invention was made with United States Government support under contract number F2960100C0171 awarded by the United States Air Force. The United States Government may have certain rights in the invention.

BACKGROUND OF INVENTION

The invention relates generally to multichip modules.

Commonly assigned Saia et al., U.S. Pat. No. 5,657,537, describes a method for fabricating a stack of circuit modules by providing a plurality of substrates having module interconnection layers. Each of the substrates has a circuit chip with chip pads positioned therein and an electrically conductive feed-through line extending from a top surface of the substrate to a side surface of the substrate. Each of the module interconnection layers is situated over a respective top surface of each of the substrates and includes a module dielectric layer having module vias therein and a module pattern of electrical conductors extending through the module vias to couple the selected chip pads to the feed-through line. The plurality of substrates are stacked. A side interconnection layer is applied over the side surfaces of the substrates. The side interconnection layer includes a side dielectric layer having side vias therein aligned with predetermined ones of the feed-through lines and a side pattern of electrical conductors extending through the side vias.

For high power applications (such as applications involving power densities in the range of about 1 Watt per square inch to about 10 Watts per square inch, for example), conventional high density interconnect (HDI) materials often do not transfer sufficient heat through a stack because an intrinsic thermal gradient exists at each level of the stack. In a conventional stack of HDI modules, each module's substrate adds heat energy and passes the heat energy on to a respective underlying substrate. Therefore, an inherent temperature progression limits the number of layers that can be stacked before excessive heat would result in delamination of adhesives and/or other damage to the interconnection layers and conductors. Additionally, high power applications typically include high power processors which require more current with an associated intrinsic voltage drop. These processors are typically limited to the bottom of the stack adjacent to an attached heat sink.

It would therefore be desirable to provide a compact thermal structure for dissipating and managing heat throughout a stack of modules and for providing low impedance power to substrates of the stack.

SUMMARY OF INVENTION

Briefly, in accordance with one embodiment of the present invention, a method for fabricating a substrate package for a high density interconnect multichip module stack comprises: providing a substrate having holes extending therethrough and having a bottom surface with metallization situated thereon; providing a metal sheet having grooves extending therethrough; attaching the metal sheet to the bottom surface of the substrate; attaching metal plugs through the holes to the metal sheet; and removing portions of the substrate to expose the metal plugs and separate the metal sheet into a plurality of segments defined by the grooves.

In accordance with another embodiment of the present invention, a high density interconnect multichip module stack comprises; a plurality of substrate packages, each substrate package comprising a substrate including a bottom surface with metallization situated thereon, metal plugs, each metal plug extending through the substrate and having an exposed plug surface on a respective side surface of the substrate, and a metal sheet attached to the bottom surface of the substrate and to the metal plugs, the metal sheet having grooves extending therethrough to define a plurality of separate segments; and metal bars coupling respective plugs of the plurality of stacked substrate packages.

BRIEF DESCRIPTION OF DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION

Figure 1:
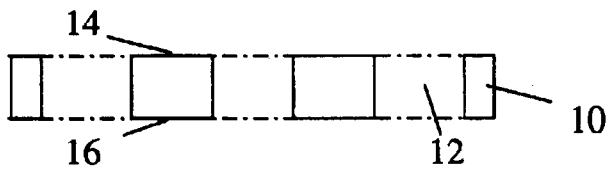
FIGS. 1, 2, and 3 are respective sectional side, top, and bottom views of a substrate for use in accordance with an embodiment of the present invention.
Figure 2:
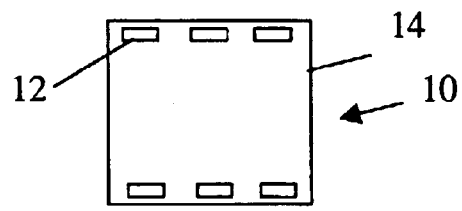
Figure 3:
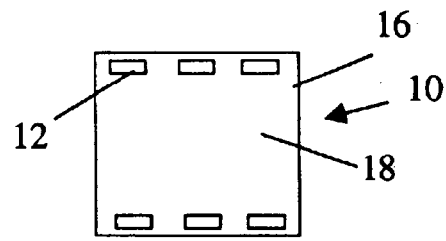

FIGS. 1, 2, and 3 are respective sectional side, top, and bottom views of a substrate 10 for use in accordance with an embodiment of the present invention. Substrate 10 has top and bottom surfaces 14 and 16 and holes 12 extending therethrough. Top and bottom are used herein for purposes of example only. The embodiments of the present invention are not intended to be limited to any particular physical orientation.

Figure 14:
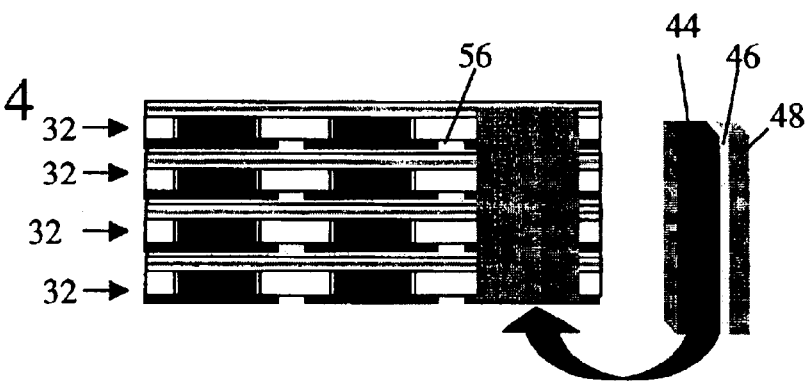
FIG. 14 is a partial side and partial perspective view of a stack of the substrate packages of FIG. 13 and a metal bar interconnecting a set of metal plugs.

Substrate 10 may comprise any structurally appropriate material, and in one embodiment, the substrate comprises a ceramic, for example. If desired, substrate 10 may include feed-through lines (not shown) such as those discussed in aforementioned Saia et al., U.S. Pat. No. 5,657,537, for interconnecting circuit chips on different substrates of a substrate stack (FIG. 14). So as to minimize waste of material when portions of the substrate are later removed (FIGS. 10–12), holes 12 are situated near the substrate edges. For example, in one embodiment, the holes are situated at a distance of about 750 micrometers from the respective substrate edges and have dimensions of about 13,450 micrometers by about 2508 micrometers.

The holes may be fabricated by any appropriate techniques with several examples being mechanical milling and laser cutting. At this stage in the fabrication process it can be convenient to similarly fabricate chip wells 36 (not shown in FIG. 1 but shown in FIG. 11) in top surface 14 of the substrate. After holes 12 are formed, metallization 18 (FIG. 3) is applied to the bottom surface of the substrate. In one embodiment, metallization 18 comprises a solderable material. In a more specific embodiment, metallization 18 comprises a multilayer sputtered metallization of adhesion promoter (1000 angstroms of titanium, for example), coated by 1.2 micrometers of copper, coated by the solderable material (1.2 micrometers of nickel coated by 1500 angstroms of gold, for example).

Figure 4:
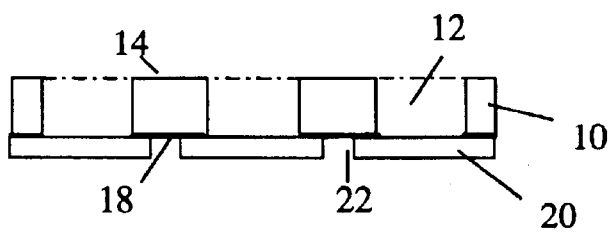
FIGS. 4, 5, and 6 are respective sectional side, top, and bottom views of the substrate of FIGS. 1–3 further illustrating a metal sheet.
Figure 5:
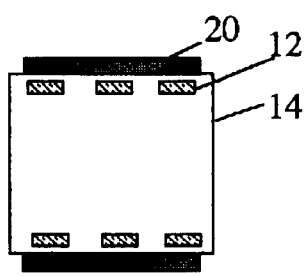
Figure 6:
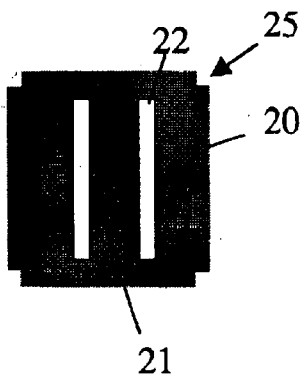

FIGS. 4, 5, and 6 are respective sectional side, top, and bottom views of the substrate of FIGS. 1–3 further illustrating a metal sheet 20 facing the bottom surface 16 of the substrate. Metal sheet 20 can be used to act as a lateral heat spreader and/or as a path to provide power and/or ground distribution across the bottom surface of the substrate. Thus, the metal sheet comprises an electrically conductive material with good thermal and power delivery capabilities. Metal sheet 20 has grooves 22 extending therethrough for reducing mechanical stress and for use in later separating segments of the sheet electrically to provide power, ground, and/or thermal paths. In one embodiment, the grooves have a thickness of about 10 mils. Until segments of the metal sheets are separated, tie bars 21 can be present for ease of fabrication.

In one embodiment, for example, the metal sheet comprises copper. In a more specific embodiment, the metal sheet has a thickness of about 250 micrometers. In one embodiment, the metal sheet additionally comprises a solderable metal such as 3.5 micrometers of nickel coated with 1500 angstroms of gold coated on a surface to be coupled with the substrate and an adhesion primer layer such as 2000 angstroms of titanium for later stacking.

Metal sheet 20 may optionally have edge dimensions adapted to be aligned with edges of the substrate. For example, if the metal sheet includes removed corners 25, alignment with substrate 10 and removal of tie bars 21 are facilitated.

Figure 7:
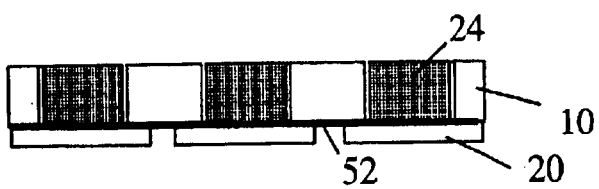
FIGS. 7, 8, and 9 are respective sectional side, top, and bottom views of the substrate of FIGS. 4–6 further illustrating metal plugs.
Figure 8:
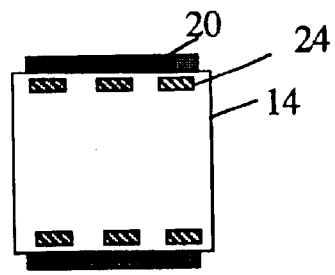
Figure 9:
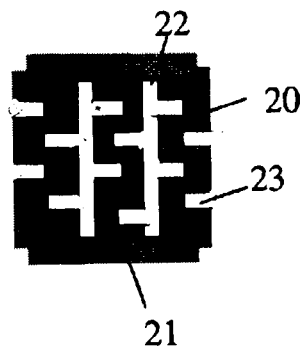

FIGS. 7, 8, and 9 are respective sectional side, top, and bottom views of the substrate of FIGS. 4–6 further illustrating metal plugs 24. FIG. 9 illustrates an alternative embodiment of metal sheet 20 wherein notches 23 are added in addition to the grooves to further reduce mechanical stress. Although notches 23 are shown as rectangular for purposes of example, any appropriate shape may be used.

In a similar manner as discussed with respect to metal sheet 20, metal plugs 24 comprise an electrically conductive material with good thermal and power delivery capabilities, and, in one embodiment, for example, comprise copper. In a more specific embodiment, the metal plugs additionally comprise a solderable metal such as 3.5 micrometers of nickel coated with 1500 angstroms of gold coated on a surface to be coupled with the substrate and an adhesion primer layer such as 2000 angstroms of titanium coated on an opposing surface for high density interconnect multichip module fabrication.

In one embodiment, the metal sheet and metal plugs are simultaneously attached by positioning a preform 52 comprising a material such as solder, in one example, between the bottom surface of the substrate and the metal sheet, positioning the metal plugs through the holes, and heating the solder preform. The solderable portions of the metal sheet and the metal plugs are positioned to face the solder preform. One example of a solder preform is a combination of 97.5 lead, 1.5 silver, 1 tin with a 309° C. eutectic. The preform need not necessarily comprise solder. Depending upon the power requirements, another useful preform material is diamond-filled epoxy, for example.

Prior to being attached, the metal sheet may be annealed to lower the modulus and increase the ductility (and thus to reduce stress which may otherwise occur due to the differences in coefficients of thermal expansion between the metal sheet and the substrate). In one embodiment, the metal sheet is annealed at a temperature higher than the highest processing temperature. For example, in the embodiment where the solder preform attach temperature is in the range of about 309° C. to about 320° C., the anneal may be performed at about 350° C. for about 10 min.

Figure 10:
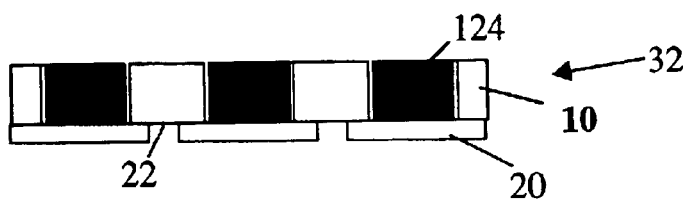
FIGS. 10, 11, and 12 are respective side, top, and bottom views of the substrate of FIGS. 7–9 further illustrating the substrate after a portion of the substrate material has been removed.
Figure 11:
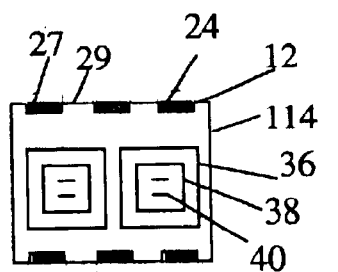
Figure 12:
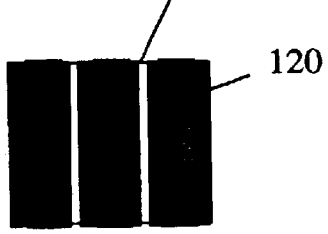

FIGS. 10, 11, and 12 are respective side, top, and bottom views of the substrate of FIGS. 7–9 further illustrating the substrate after a portion of the substrate material has been removed to provide exposed plug surfaces 27 (FIG. 11) of metal plugs 24 and remove any tie bars (tie bars 21 shown FIGS. 6 and 9). After the metal sheet and metal plugs are attached, edge portions of the substrate are removed from one or more side surfaces 29 to expose the metal plugs and separate the metal sheet into a plurality of segments 120 (FIG. 12) defined by grooves 22 to form the substrate package 32. In one embodiment, the edge portions are removed by cutting, for example. For oxidation protection, titanium can be sputter-deposited on exposed surfaces of the metal plugs through a stencil mask, for example, to a thickness of about 2000 angstroms. Furthermore, if solder is present in the area of grooves 22, it can be removed by laser ablation, for example, to electrically isolate segments 120.

Figure 13:
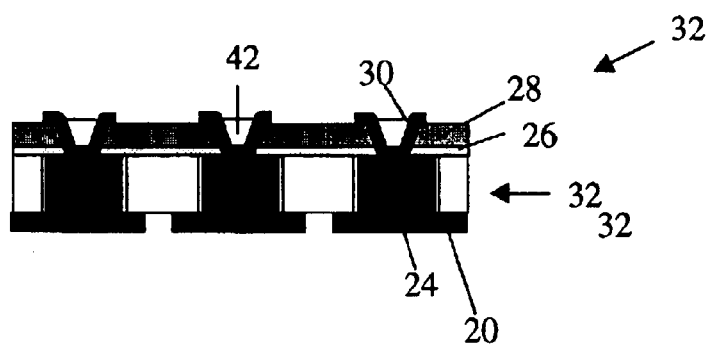
FIG. 13 is a side view of the substrate package of FIG. 10 further illustrating electrical interconnections for the metal plugs.

FIG. 13 is a side view of substrate package 32 of FIG. 10 further illustrating electrical interconnections for metal plugs 24. If desired, a dielectric layer 28 can be provided over top surface 14 of the substrate. In one embodiment, the dielectric layer comprises KAPTON™ polyimide (KAPTON is a trademark of DuPont Co.) having a thickness of about 25 micrometers attached with an adhesive 26 comprising a material such as siloxane polyimide epoxy (SPIE) having a thickness of about 12.5 micrometers. Next vias 42 are formed in the dielectric layer, and then a pattern of electrical conductors 30 is provided on the dielectric layer and extends through the vias to at least some of the metal plugs. Alternatively, vias 42 can be prepatterned in the dielectric layer prior to attachment of the dielectric layer.

In one embodiment, prior to applying dielectric layer 28, circuit chips 38 are positioned in the chip wells 36 (See FIG. 11). The circuit chips include chip pads 40. Chip pads 40 may be interconnected using vias 42 and pattern of electrical conductors 30 or by a separate interconnection layer.

Figure 15:
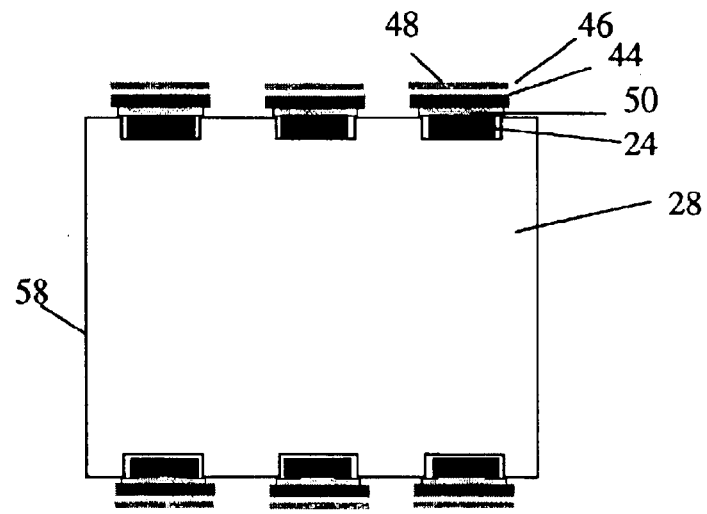
FIG. 15 is a top view of the embodiment of FIG. 14.

FIG. 14 is a partial side and partial perspective view of a high density interconnect (HDI) multichip module (MCM) stack 54 of the substrate packages of FIG. 13 and a metal bar 44 coupling a set of metal plugs, and FIG. 15 is a top view of the embodiment of FIG. 14.

Substrate packages 32 can be glued together with an adhesive 56 such as SILTEM™/BENZOFLEX™ thermoplastic adhesive (SILTEM is a trademark of General Electric Company, and BENZOFLEX is a trademark of Velsicol Chemical Corporation). The adhesive is preferably a film that is cut to the same size as the substrate package and allowed to flow past the substrate package edges during heating to completely fill any gaps between the substrate packages. A side edge of the stack can be planarized by a technique such as grinding to remove any excess adhesive. If feed-through lines (not shown) are used, a side dielectric layer (not shown) can be laminated on surface 58 of the stack, for example, and interconnections can be formed as described in aforementioned Saia et al., U.S. Pat. No. 5,657,537, for example.

Metal bar 44 comprises an electrically conductive material with good thermal and power delivery capabilities. In one embodiment, for example, the metal bar comprises copper and has a thickness of about 1000 micrometers. In a more specific embodiment, the metal bar additionally comprises titanium coated on both sides of the copper to a thickness of about 2000 angstroms for adhesion promotion. In another embodiment, the metal bar comprises a copper and diamond matrix laminate.

A conductive adhesive 50 (FIG. 15) can be used to attach the metal bar to stack 54. In one embodiment, for example, the conductive adhesive comprises silver epoxy. Dielectric covers 48 may be applied to metal bars 44 prior to or after the attachment of the metal bars to the stack. In one embodiment, the dielectric covers comprise KAPTON polyimide having a thickness of about 25 micrometers and are attached using an adhesive 46 comprising SPIE adhesive having a thickness of about 12.5 micrometers.

Metal bars 44 can thus be used to distribute power and/or ground connections between substrate packages 32 and/or to conduct thermal energy laterally from each substrate package via a thermally conductive, electrically non-conductive adhesive to a thermal sink (not shown) which can optionally be attached on the bottom of stack 54. When the substrates include high power circuit chips, embodiments of the present invention thus enable use of multiple MCMs to be stacked in respective. substrate packages while maintaining a minimal thermal gradient from MCM to MCM. When metal sheets 20 (FIG. 13) are attached to each substrate 10, heat primarily flows through the substrates to the metal sheets and then laterally to the metal plugs 24 and metal bars 44. Thus, a stack designer may design many layers of substrate packages 32 in a stack as well as a side cooling path and a low impedance electrical path. In essence the metal bars and metal sheets thermally isolate each substrate package. In some embodiments, the substrate packages need not be attached with adhesive 56 (FIG. 14) because, even with an air gap, the thermal path remains.

The thicknesses and dimensions of metal sheets 20, metal plugs 24, and metal bars 44 can be adjusted in proportion to the power handling capability of the intended embodiment and/or can be adjusted in proportion to the number of levels in the stack of the intended embodiment.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating a substrate package, for a high density interconnect multichip module stack comprising:
   providing a substrate having holes extending therethrough and having a bottom surface;
   providing a metal sheet having grooves extending therethrough;
   attaching the metal sheet to the bottom surface of the substrate with the grooves facing the bottom surface and with at least a portion of the metal sheet being in thermal contact with the bottom surface;
   attaching metal plugs through the holes to the metal sheet; and
   removing portions of the substrate to further expose the metal lugs and separate the metal sheet into a plurality of segments defined by the grooves.

2. The method of claim 1 wherein attaching the metal sheet to the bottom surface of the substrate and attaching the metal plugs through the holes to the metal sheet comprises positioning a preform between the bottom surface of the substrate and the metal sheet, positioning the metal plugs through the holes, and heating the preform.

3. The method of claim 1 further comprising, prior to attaching the metal sheet to the bottom surface of the substrate, annealing the metal sheet.

4. The method of claim 1 further including:
   providing a dielectric layer over a top surface of the substrate, the dielectric layer having vias extending therethrough to at least some of the metal plugs; and
   providing a pattern of electrical conductors on the dielectric layer and extending through the vias to the at least some of the metal plugs.

5. The method of claim 4 further comprising, prior to applying the dielectric layer, providing chip wells in the top surface of the substrate, and positioning circuit chips in the chip wells, the circuit chips including chip pads.

6. The method of claim 5 wherein
   providing the dielectric layer comprises providing the dielectric layer having vias extending therethrough to at least some of the chip pads; and
   providing the pattern of electrical conductors comprises providing a pattern of electrical conductors extending through the vias to the at least some of the chip pads.

7. A method for fabricating a high density interconnect multichip module stack comprising:
   stacking a plurality of substrate packages, each substrate package comprising a substrate including a bottom surface, metal plugs, each metal plug extending through the substrate and having an exposed plug surface on a respective side surface of the substrate, and a metal sheet attached to and being in thermal contact with the bottom surface of the substrate and the metal plugs, the metal sheet having grooves extending therethrough and facing the bottom surface to define a plurality of separate segments; and
   coupling metal bars to respective plugs of the plurality of stacked substrate packages.

8. The method of claim 7 further comprising fabricating each substrate package by:
   providing a substrate having holes extending therethrough and having a bottom surface;
   providing a metal sheet having grooves extending therethrough;
   attaching the metal sheet to the bottom surface of the substrate with the grooves facing the bottom surface and with at least a portion of the metal sheet being in thermal contact with the bottom surface;
   attaching metal plugs through the holes to the metal sheet; and
   removing portions of the substrate to further expose the metal plugs and separate the metal sheet into a plurality of segments defined by the grooves.

9. A substrate package for a high density interconnect multichip module stack, the substrate package comprising:
   a substrate including a bottom surface;
   metal plugs, each metal plug extending through the substrate and having an exposed plug surface on a respective side surface of the substrate; and a metal sheet attached to and being in thermal contact with the bottom surface of the substrate and the metal plugs, the metal sheet having grooves extending therethrough and facing the bottom surface to define a plurality of separate segments.

10. The package of claim 9 further including:

a dielectric layer over a top surface of the substrate, the dielectric layer having vias extending to at least some of the metal plugs;

a pattern of electrical conductors on the dielectric layer and extending through the vias to the at least some of the metal plugs.

11. The package of claim 10 further comprising chip wells in the top surface of the substrate, and circuit chips in the chip wells, the circuit chips including chip pads.

12. The package of claim 11 wherein the dielectric layer includes vias extending therethrough to at least some of the chip pads; and the pattern of electrical conductors extends through the vias to the at least some of the chip pads.

13. The package of claim 9 wherein at least one of the separate segments of the metal sheet includes notches therein.

14. A high density interconnect multichip module stack comprising:

plurality of substrate packages, each substrate package comprising a substrate including a bottom surface, metal plugs, each metal plug extending through the substrate and having an exposed plug surface on a respective side surface of the substrate, and a metal sheet attached to and being in thermal contact with the bottom surface of the substrate and the metal plugs, the metal sheet having grooves extending therethrough and facing the bottom surface to define a plurality of separate segments; and metal bars coupling respective plugs of the plurality of stacked substrate packages.

15. The stack of claim 14 wherein each substrate package further comprises:

a dielectric layer over a top surface of the substrate, the dielectric layer having vias extending to at least some of the metal plugs;

a pattern of electrical conductors on the dielectric layer and extending through the vias to the at least some of the metal plugs.

16. The stack of claim 15 wherein each substrate package further comprises chip wells in the top surface of the substrate, and circuit chips in the chip wells.

17. The stack of claim 14 wherein at least one of the substrate packages comprises at least one of the separate segments of the metal sheet including notches therein.

18. The stack of claim 14 wherein at least one of the metal bars is adapted to dissipate heat from the stack.

19. The stack of claim 14 wherein at least one of the metal bars is adapted to provide power to at least one of the substrate packages.

20. The stack of claim 14 wherein at least one of the metal bars is adapted to provide a ground connection for at least one of the substrate packages.

* * * * *

UNITED STATES PATENT AND TRADEMARK OFFICE
CERTIFICATE OF CORRECTION

PATENT NO. : 6,429,381 B1
DATED : August 6, 2002
INVENTOR(S) : Richard J. Saia et al.

It is certified that error appears in the above-identified patent and that said Letters Patent is hereby corrected as shown below:

Column 6,
Line 4, please delete "metal lugs and separate the metal sheet into a plurality"
and insert -- metal plugs and separate the metal sheet into a plurality --

Signed and Sealed this

Twenty-eighth Day of January, 2003

JAMES E. ROGAN
*Director of the United States Patent and Trademark Office*